US009620634B2

(12) United States Patent
Iannaccone et al.

(10) Patent No.: US 9,620,634 B2
(45) Date of Patent: Apr. 11, 2017

(54) FIELD-EFFECT TRANSISTOR WITH TWO-DIMENSIONAL CHANNEL REALIZED WITH LATERAL HETEROSTRUCTURES BASED ON HYBRIDIZED GRAPHENE

(71) Applicants: Giuseppe Iannaccone, Pisa (IT); Fiori Gianluca, Lucca (IT)

(72) Inventors: Giuseppe Iannaccone, Pisa (IT); Fiori Gianluca, Lucca (IT)

(73) Assignee: UNIVERSITA DI PISA, Pisa (IT)

( * ) Notice: Subject to any disclaimer, the term of this patent is extended or adjusted under 35 U.S.C. 154(b) by 0 days.

(21) Appl. No.: 14/362,269

(22) PCT Filed: Nov. 30, 2012

(86) PCT No.: PCT/IT2012/000363
§ 371 (c)(1),
(2) Date: Jun. 2, 2014

(87) PCT Pub. No.: WO2013/080237
PCT Pub. Date: Jun. 6, 2013

(65) Prior Publication Data
US 2014/0319467 A1    Oct. 30, 2014

(30) Foreign Application Priority Data

Dec. 2, 2011   (IT) ................ PI2011A0135

(51) Int. Cl.
*H01L 31/00*    (2006.01)
*H01L 29/778*    (2006.01)
(Continued)

(52) U.S. Cl.
CPC ............ *H01L 29/778* (2013.01); *B82Y 10/00* (2013.01); *H01L 29/0895* (2013.01);
(Continued)

(58) Field of Classification Search
CPC .......... H01L 29/1606; H01L 21/02527; H01L 29/7781; H01L 29/78684; H01L 29/78696;
(Continued)

(56) References Cited

U.S. PATENT DOCUMENTS

2009/0169919 A1 * 7/2009 Garcia ................ C23C 14/0605
428/688
2011/0309335 A1   12/2011 Mehr et al.
(Continued)

FOREIGN PATENT DOCUMENTS

WO    WO2011/094597    *    8/2011

OTHER PUBLICATIONS

International Search Report issued Apr. 17, 2013, corresponding to International Patent Application No. PCT/IT2012/000363.
(Continued)

*Primary Examiner* — Robert Bachner
(74) *Attorney, Agent, or Firm* — Ladas & Parry LLP

(57) ABSTRACT

The invention is a field-effect transistor with a channel consisting of a thin sheet of one or more atomic layers of lateral heterostructures based on hybridized graphene. The role of lateral heterostructures is to modify the energy gap in the channel so as to enable the effective operation of the transistor in all bias regions. This solution solves the problem of the missing bandgap in single-layer and multi-layer graphene, which does not allow the fabrication of transistors that can be efficiently switched off. The possibility of fabricating lateral heterostructures, with patterns of domains with different energy dispersion relations, enables the realization of field-effect transistors with additional functionalities with respect to common transistors.

6 Claims, 4 Drawing Sheets

Figure 1:
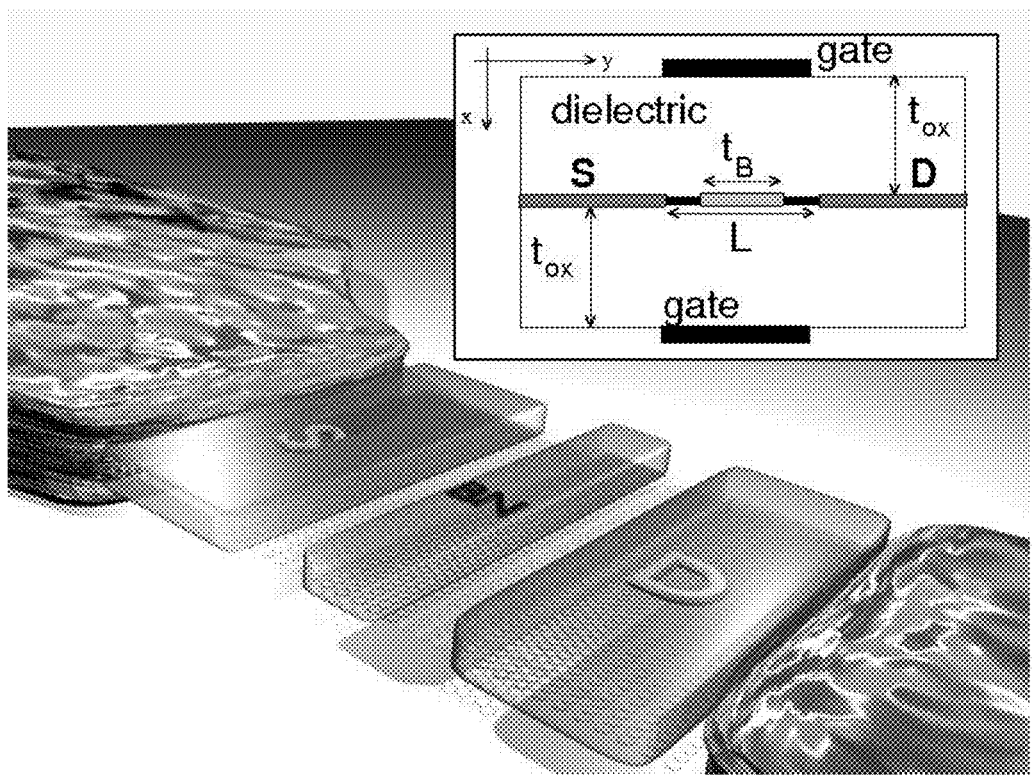

(51) Int. Cl.
  *H01L 29/786* (2006.01)
  *H01L 29/08* (2006.01)
  *H01L 29/16* (2006.01)
  *H01L 29/66* (2006.01)
  *H01L 29/772* (2006.01)
  *H01L 29/267* (2006.01)
  *B82Y 10/00* (2011.01)

(52) U.S. Cl.
  CPC ........ *H01L 29/1606* (2013.01); *H01L 29/267* (2013.01); *H01L 29/66977* (2013.01); *H01L 29/772* (2013.01); *H01L 29/786* (2013.01); *H01L 29/78684* (2013.01); *H01L 29/78696* (2013.01)

(58) Field of Classification Search
  CPC ........... H01L 21/0237; H01L 21/02447; H01L 21/0245; H01L 21/02507; H01L 21/02516; H01L 21/02529; H01L 21/02587; H01L 21/026
  See application file for complete search history.

(56) References Cited

U.S. PATENT DOCUMENTS

2011/0313194 A1  12/2011  Lee et al.
2012/0301953 A1  11/2012  Duan et al.
2013/0033310 A1   2/2013  Liu

OTHER PUBLICATIONS

Viana Gomes J et al.:"Tunneling of Dirac electrons through spatial regions of finite mass", Journal of Physics: Condensed Matter, Institute of Physics Publishing, Bristol, GB, vol. 20, No. 32, Aug. 13, 2008.

Han Wang et al. :"BN/Graphene/BN Transistors for RF Applications", IEEE Electron Device Letters, IEEE Service Center, New York, NY, US, vol. 32, No. 9, Sep. 1, 2011.

Fiori G et al. :"Nanodevices in Flatland: Two-dimensional graphene-based transistors with high I on /I off ratio", Electron Devices Meeting (IEDM), 2011 IEEE International, IEEE, Dec. 5, 2011.

* cited by examiner

FIELD-EFFECT TRANSISTOR WITH TWO-DIMENSIONAL CHANNEL REALIZED WITH LATERAL HETEROSTRUCTURES BASED ON HYBRIDIZED GRAPHENE

FIELD OF THE INVENTION

The invention is in the field of graphene-based electronics, and in general field-effect transistors realized with lateral heterostructures based on hybridized graphene.

BACKGROUND OF THE INVENTION

Graphene has interesting electronic properties, such as the high mobility and the symmetric dispersion relation for electrons and holes. It also has a zero energy bandgap, and therefore cannot be directly used as channel material of field-effect transistors. Indeed, the zero gap does not represent an effective barrier to electron and hole transport, and it is therefore not possible to fully switch the transistor off. [Lemme, M.; Echtermeyer, T.; Baus, M.; Kurz, H. A graphene field-effect device. IEEE Electr. Dev. Lett. 2007, 28, 282-284.] [Avouris, P.; Chen, Z.; Perebeinos, V. Carbon-based electronics. Nat. Nanotech. 2007, 2, 605-615.]

Recent experiments have shown the possibility of fabricating two-dimensional hybrid heterostructures consisting of intercalated carbon and h-BCN (hexagonal boron-carbon-nitrogen) domains, whose electronic and mechanical properties can be tuned by varying the relative fractions of the three elements. Graphene has a zero energy bandgap, but h-BCN domains can have a gap between 1 and 5 eV, as shown in [Ci, L.; Song, L.; Jin, C.; Jariwala, D.; Wu, D.; Li, Y.; Srivastava, A.; Wang, Z. F.; Storr, K.; L. Balicas, P. M. A., F. Liu, Nat. Mater. 2001, 9, 430.]

On the basis of these results, we describe the invention of a new family of transistors with fully two-dimensional channel based on hybridized graphene engineering. This approach can open new routes for graphene nanoelectronics, since hybrid h-BCN-graphene structures can allow to suppress the ambipolar behavior, blocking the flow of one type of carriers, and to fully modulate current due to carriers of the other type.

DISCLOSURE OF THE INVENTION

First Embodiment

A first embodiment of the proposed field-effect transistor (FET) is illustrated in FIG. 1 (its longitudinal cross-section in the inset of FIG. 1). The channel is represented by the plane with hexagonal crystal and extends from the source contact (S) to the drain contact (D). The channel consists of graphene, except for a central domain of length $t_B$ of h-BCN. Below and above the channel two layers of insulator (dielectric) of thickness $t_{ox}$ are present, and two gates (gate) of length L. Graphene regions below the gate are undoped, whereas those forming the source and drain extensions are doped with molar fraction f.

The barrier in the channel consists of h-BCN, such as for example boron nitride (BN), different configurations with a 50% carbon concentration ($BC_2N$), or with a 75% carbon concentration ($BC_6N$), or other bidimensional material compatible with graphene.

Figure 2:
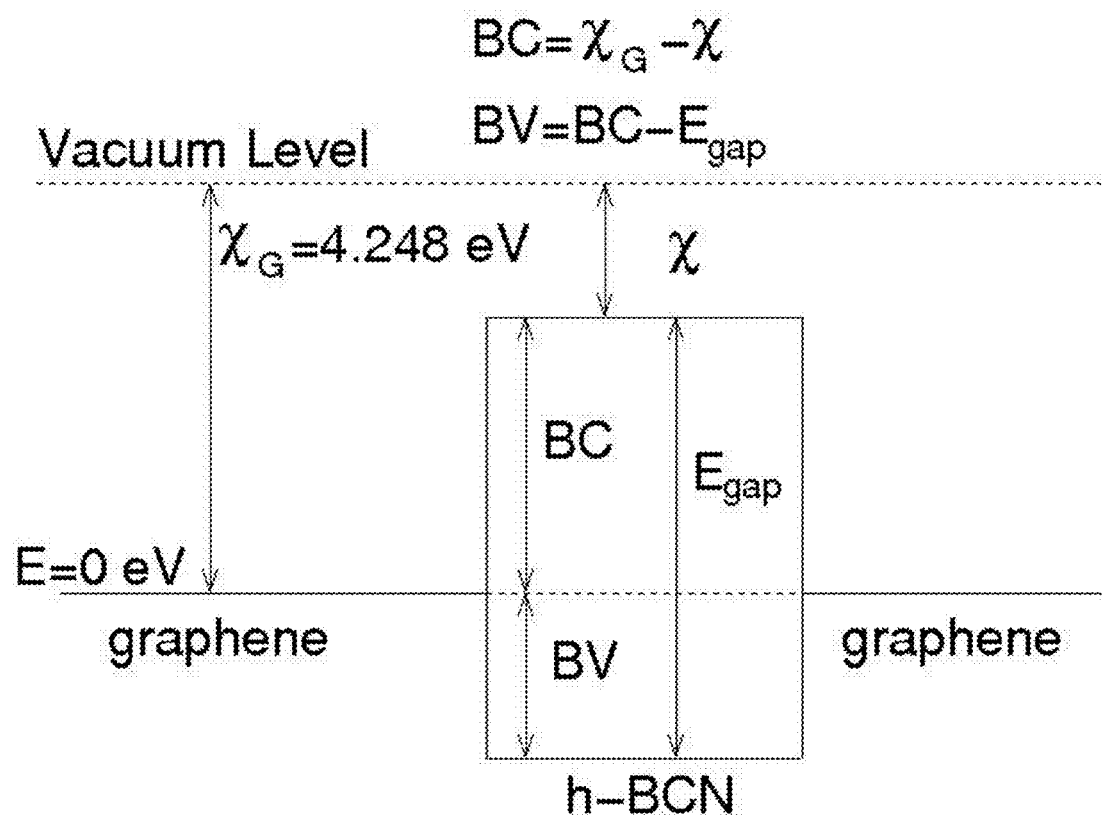

If the intrinsic Fermi level of graphene is considered as the referring potential (equal to zero), and $\chi_G$=4.248 eV is graphene electron affinity, the barrier heights seen by electron and holes read BC=$\chi_G-\chi$, and BV=$|\chi_G-\chi-E_{gap}|$, respectively, as illustrated in FIG. 2.

Figure 3:
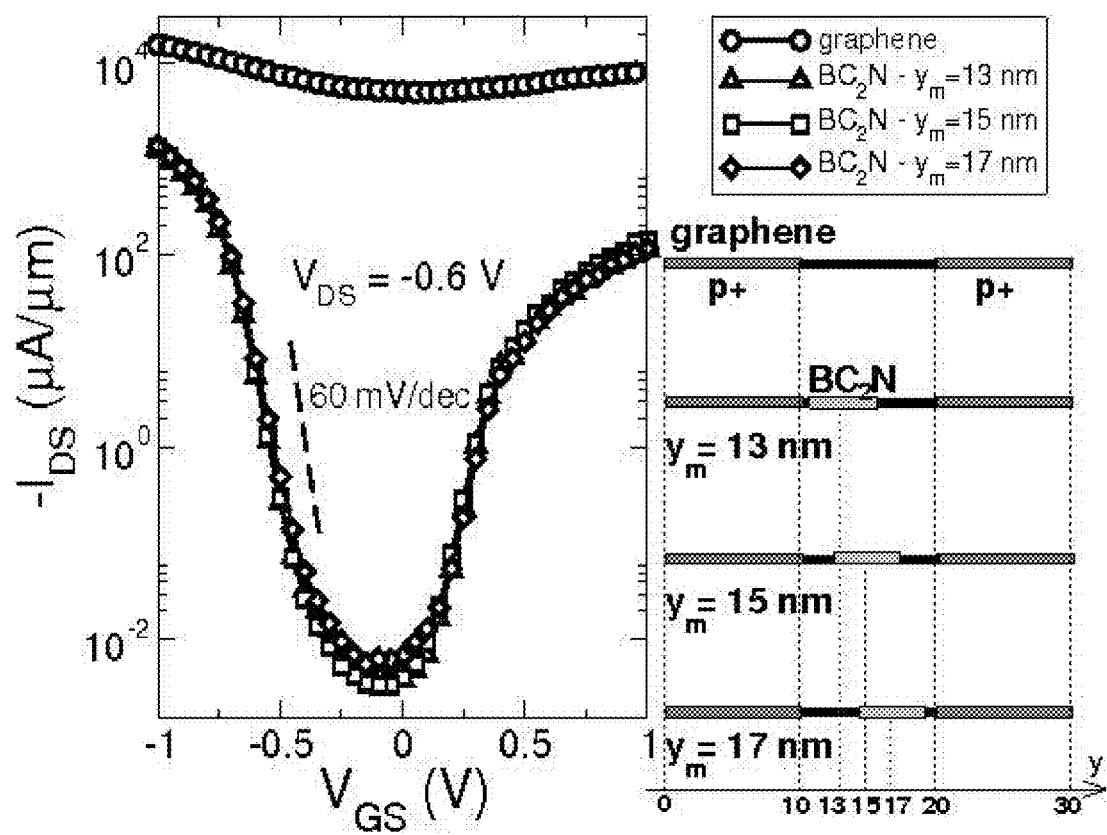

In FIG. 3 we show the transfer characteristics computed with the NANOTCAD ViDES software package of a p-type FET with a $BC_2N$ barrier (energy gap 1.6 eV) for different positions $y_m$ of the middle of the barrier along the longitudinal direction, when applying a voltage of 0.6 V between source and drain.

In the same figure, we show as a reference the transfer characteristics of a FET with the same structure but a channel of monolayer graphene, without any barrier. The so called "Ion/Ioff ratio", i.e. the ratio of the maximum current to the minimum current for a variation of the gate voltage equal to the voltage applied between source and drain (0.6 V in the case shown) is smaller than 10 for the reference graphene transistor, whereas is larger than 10000 for the FET with $BC_2N$ channel, with no appreciable dependence on $y_m$.

Metal double gates enable a good control of the barrier in the channel. However, despite the double-gate structure, the subthreshold slope is good (80 mV/decade), but not ideal (60 mV/dec). This can be explained by the presence of a high local density of states in the overlap regions between graphene and gate, which induces a large quantum capacitance in the channel. On the other hand, an underlap (i.e. L<$t_B$) would deteriorate the gate control over the channel barrier, due to the formation of Schottky-like contacts between the barrier and source/drain extensions.

Second Embodiment

Figure 4:
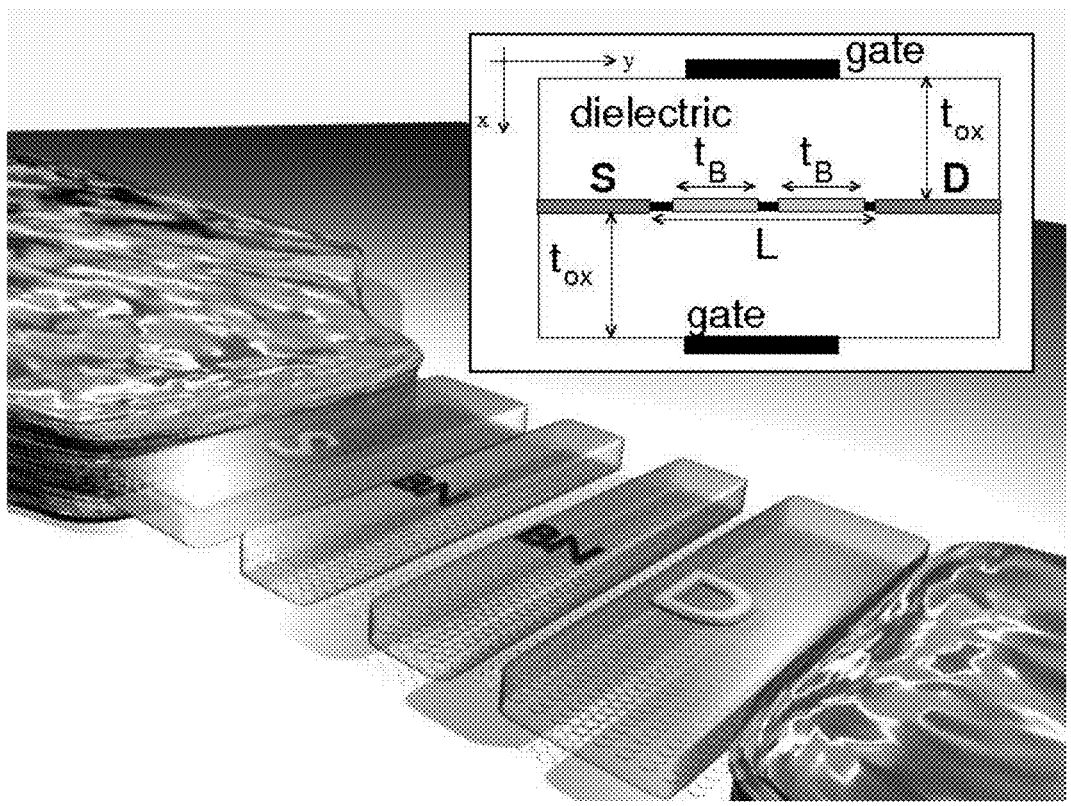

A second embodiment is represented by a Resonant Tunneling FET (RTFET), where two h-BCN domains of length $t_B$ are present in the channel and under the gate, separated by a graphene region of length w, as shown in FIG. 4.

In this case the two barriers form a Fabry-Perot resonator for charge carriers that can be modulated in energy through the gate voltage. In this way we can obtain a transfer characteristics with a negative transconductance region. The thinner the field oxide, the better the gate control over the channel barrier, and the steeper the regions where negative differential transconductance appears.

The described RTFET enables a much better electrostatic control of the channel by the gate than other proposals of RTFETs in the literature, typically based on III-V materials systems [Capasso, F.; Sen, S.; Gossard, A.; Hutchinson, A.; English, J. Quantum well resonant tunneling bipolar transistor operating at room temperature. Proc. of International Electron Device Meeting 1986, 282-285].

Hybridized graphene with intercalated carbon and h-BCN represents an exceptional platform for exploring truly two-dimensional nanoelectronics. The possibility to engineer the electronic properties of the channel with h-BCN allows to obtain excellent current modulation in graphene-based FETs. Additional functionalities can be achieved introducing lateral heterostructures with additional domains, as shown in the case of RTFETs.

Experts can easily explore further modifications and advantages. For this reason, the present invention should not be limited to the specific details and representative embodiments shown in this document. As a consequence, various modifications can be done without departing from the scope of the invention and of its general concept, defined by the following claims.

The invention claimed is:

1. A field effect transistor comprising a source, a two-dimensional channel, a drain and a gate, arranged in such a way that charge carriers flowing through said two-dimensional channel from said source to said drain define a longitudinal direction of said two-dimensional channel, wherein said two-dimensional channel comprises a lateral heterostructure consisting in the intercalation of mono- or multi-atomic layer graphene domains, and a domain of a different material compatible with graphene, wherein the domain of the different material is arranged in such a way that:
- charge carriers flowing from said source to said drain in said longitudinal direction must flow through said domain of said different material; and
- said domain of said different material acts as a barrier controlled by said gate against said charge carriers flowing from said source to said drain in said longitudinal direction.

2. The field effect transistor according to claim 1, wherein said domain of said different material contains a single domain of hexagonal boron-carbon-nitride.

3. The field effect transistor according to claim 1, wherein said domain of said different material contains two domains of hexagonal boron-carbon-nitride separated by a narrow graphene region that is arranged in such a way that charge carriers flowing from said source to said drain through said domain of said different material must flow both through said two domains of hexagonal boron-carbon-nitride and through said narrow graphene region, so that said device can operate as a resonant tunneling field-effect transistor.

4. The field effect transistor according to claim 2, wherein the single domain of hexagonal boron-carbon-nitride is selected from the group consisting of boron nitride, 50% carbon concentration hexagonal boron-carbon-nitride, or a 75% carbon concentration hexagonal boron-carbon-nitride.

5. The field effect transistor according to claim 1, wherein said domain of said different material contains a domain of vacancies of carbon atoms.

6. The field effect transistor according to claim 2, wherein said domain of said different material contains a domain of dielectric material.

* * * * *